United States Patent
Jeon et al.

(10) Patent No.: US 7,670,916 B2
(45) Date of Patent: Mar. 2, 2010

(54) SEMICONDUCTOR DEVICE DOPED WITH SB, GA, OR BI AND METHOD OF MANUFACTURING THE SAME

(75) Inventors: Sang-Hun Jeon, Seoul (KR); Chung-Woo Kim, Gyeonggi-do (KR); Hyun-Sang Hwang, Gwangju-si (KR); Sung-Kweon Baek, Gwangju-si (KR); Sang-Moo Choi, Geangju-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/417,432

(22) Filed: Apr. 2, 2009

(65) Prior Publication Data

US 2009/0227081 A1    Sep. 10, 2009

Related U.S. Application Data

(62) Division of application No. 11/333,959, filed on Jan. 17, 2006, now Pat. No. 7,531,865.

(30) Foreign Application Priority Data

Jan. 15, 2005    (KR) .................... 10-2005-0003982

(51) Int. Cl.
*H01L 21/336*    (2006.01)
*H01L 29/76*    (2006.01)

(52) U.S. Cl. ................ 438/301; 257/306; 257/315

(58) Field of Classification Search .......... 257/71, 257/306, 346, 607, E27.084–E27.097; 438/299–306
See application file for complete search history.

(56) References Cited

U.S. PATENT DOCUMENTS

| | | | |
|---|---|---|---|
| 6,329,257 B1 | 12/2001 | Luning et al. | |
| 6,982,433 B2 * | 1/2006 | Hoffman et al. | 257/18 |
| 7,319,618 B2 * | 1/2008 | Wu et al. | 365/185.26 |
| 7,354,818 B2 * | 4/2008 | Hshieh et al. | 438/223 |
| 2003/0034516 A1 | 2/2003 | Fan et al. | |
| 2003/0134474 A1 | 7/2003 | Chan et al. | |
| 2004/0251489 A1 | 12/2004 | Jeon et al. | |

FOREIGN PATENT DOCUMENTS

| | | |
|---|---|---|
| JP | 63-040378 | 2/1988 |
| JP | 10-056090 | 2/1998 |

OTHER PUBLICATIONS

English language abstract of Japanese Publication No. 63-040378.
English language abstract of Japanese Publication No. 10-056090.

* cited by examiner

*Primary Examiner*—Calvin Lee
(74) *Attorney, Agent, or Firm*—Muir Patent Consulting, PLLC

(57) ABSTRACT

A semiconductor memory device includes a first dopant area and a second dopant area in a semiconductor substrate, the first dopant area and the second dopant area doped with one selected from the group consisting of Sb, Ga, and Bi. The semiconductor memory device includes an insulating layer disposed in contact with the first dopant area and the second dopant area, and a gate electrode layer disposed in contact with the insulating layer.

10 Claims, 15 Drawing Sheets

SEMICONDUCTOR DEVICE DOPED WITH SB, GA, OR BI AND METHOD OF MANUFACTURING THE SAME

CROSS-REFERENCE TO RELATED APPLICATIONS

The above-referenced application is a Divisional of U.S. Ser. No. 11/333,959, filed on Jan. 17, 2006, now pending, which claims priority under 35 U.S.C. § 119 from Korean Patent Application No. 10-2005-0003982 filed on 15 Jan. 2005, in the Korean Intellectual Property Office, the disclosure of which are hereby incorporated by reference in its entirety.

BACKGROUND

1. Technical Field

This disclosure relates to semiconductor memory devices doped with Sb, Ga, or Bi and methods of manufacturing the same.

2. Description of the Related Art

Semiconductor memory devices are developed with a focus on increasing information storage capacity and the speeds at which information is recorded and erased. Such a semiconductor memory device includes a large number of unit memory cells circuitally connected to one another.

Each unit cell of a semiconductor memory device such as a dynamic random access memory (DRAM) DRAM includes a transistor and a capacitor. The DRAM is a volatile memory device that can quickly process accesses but has a short retention time for a stored signal.

A representative example of a volatile memory device is a flash memory. Various other types of volatile memory devices such as silicon-nitride-oxide semiconductor (SNOS) memory devices, MRAMs, PRAMs, and the like have been developed. Flash memory devices, SNOS memory devices, and floating gate type memory devices commonly use materials having high dielectric constants (high-k). For purposes of this disclosure, a high-k material may be defined as one having a dielectric constant greater than about 3.9, which is the dielectric constant of $SiO_2$.

FIGS. 1A and 1B are sectional diagrams illustrating a process of manufacturing a conventional SNOS memory device having a high-k. Referring to FIG. 1A, a tunneling oxide layer 13, a charge-trap layer 14, a blocking oxide layer 15, and a gate electrode layer 16 are sequentially formed on a semiconductor substrate 11. The tunneling oxide layer 13 may be formed of $SiO_2$ to a thickness of about 30 Å, the charge-trap layer 14 may be formed of $HfO_2$, and the blocking oxide layer 15 may be formed of $Al_2O_3$ to a thickness of 100 Å.

Next, both sides of each of the tunneling oxide layer 13, the charge-trap layer 14, the blocking oxide layer 15, and the gate electrode layer 16 are removed to form a gate. As a result, upper surfaces of the semiconductor substrate 11 are exposed on both sides of the gate.

Referring to FIG. 1B, the upper surfaces of the semiconductor substrate 11 to both sides of the gate are doped with a dopant, for example, boron (B) or phosphorous (P), using an ion implantation method. Here, the dopant is selected depending on a doping type of the semiconductor substrate 11. In other words, if the semiconductor substrate 11 is an n-type substrate, first and second dopant areas 12a and 12b are implanted with a material belonging to Group III so as to be doped with a p-type dopant. If the semiconductor substrate 11 is a p-type substrate, the first and second dopant areas 12a and 12b are implanted with a material belonging to Group V so as to be doped with an n-type dopant.

After the semiconductor substrate 11 is implanted with the dopant as shown in FIG. 1B, an annealing process is performed to activate the first and second dopant areas 12a and 12b as shown in FIG. 1B. For this purpose, the first and second dopant areas 12a and 12b are heated at a high temperature between about 900° C. and 1000° C. Once the first and second dopant areas 12a and 12b are activated by such a high temperature annealing process, the first and second dopant areas 12a and 12b may be useful in the semiconductor memory device.

However, the above-described high temperature annealing process may cause a high-k material that is used in a gate structure of a semiconductor memory device to be crystallized. In general, when the high-k material is amorphous in an initial deposition state, the high-k material must be insulated from the gate electrode layer 16 during an operation of the semiconductor memory device. However, when a material for the blocking oxide layer 15 is crystallized through the high temperature annealing process, a leakage current may be generated through a grain boundary area and may have a negative impact on the characteristics of the semiconductor memory device.

For example, FIGS. 2A and 2B illustrate characteristics of the memory devices shown in FIGS. 1A-1C that are manufactured with the high temperature annealing process described above.

FIG. 2A illustrates current-voltage (I-V) characteristics of conventional semiconductor memory devices that are annealed at temperatures of 700° C., 800° C., and 900° C. under an oxygen atmosphere. Referring to FIG. 2A, as a voltage approaches 0V, an intensity of a current is gradually reduced. However, the intensity of the current still approaches a value that is greater than zero. In particular, when the semiconductor memory device is annealed at a higher temperature of 900° C., the intensity of the current has a greater value.

FIG. 2B is a graph illustrating an X-ray diffraction (XRD) measured after the semiconductor memory device manufactured according to the process described with reference to FIGS. 1A and 1B is annealed at temperatures of 700° C., 800° C., 900° C., 950° C., and 1000° C. Referring to FIG. 2B, it can be seen that as an annealing temperature is increased, an $Al_2O_3$ peak becomes prominent at about 68°. This peak indicates that crystallization has occurred. In other words, as the annealing temperature increases, crystallization easily occurs.

FIG. 2C is a graph illustrating a retention characteristic of the semiconductor memory device manufactured according to the process described with reference to FIGS. 1A and 1B with respect to the annealing temperature. The semiconductor memory device has a high retention value less than or equal to "0.2" at the annealing temperature of 800° C. or less but a low retention value at the annealing temperature of 900° C.

Accordingly, the crystallization of a high-k material caused by a high temperature annealing process has a negative impact on the characteristics of conventional semiconductor memory devices such as those described above.

Embodiments of the invention address these and other disadvantages of the conventional art.

SUMMARY

According to embodiments of the invention, the annealing temperature required to activate first and second dopant areas in a semiconductor memory device may be lowered.

BRIEF DESCRIPTION OF THE DRAWINGS

The above and other features and advantages of the invention will become more apparent by describing in detail exemplary embodiments thereof with reference to the drawings described briefly below.

DETAILED DESCRIPTION

Figure 1A:
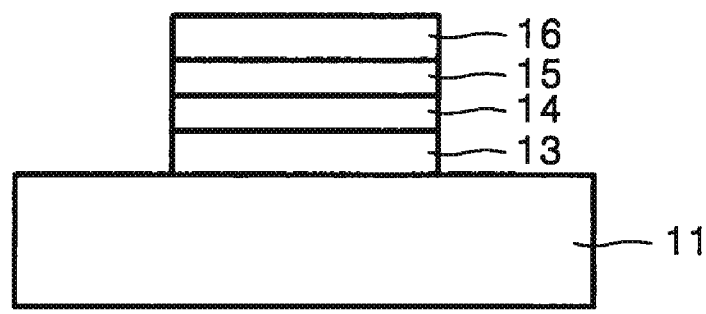
FIGS. 1A and 1B are sectional diagrams illustrating a method of manufacturing a semiconductor memory device according to the prior art.
Figure 1B:
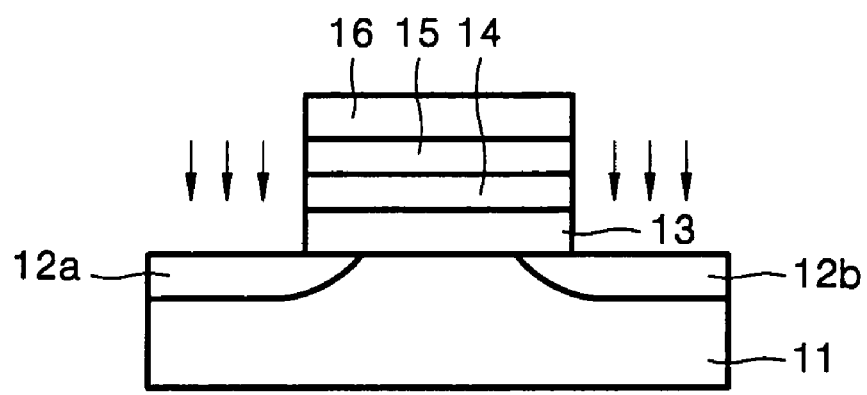
Figure 2A:
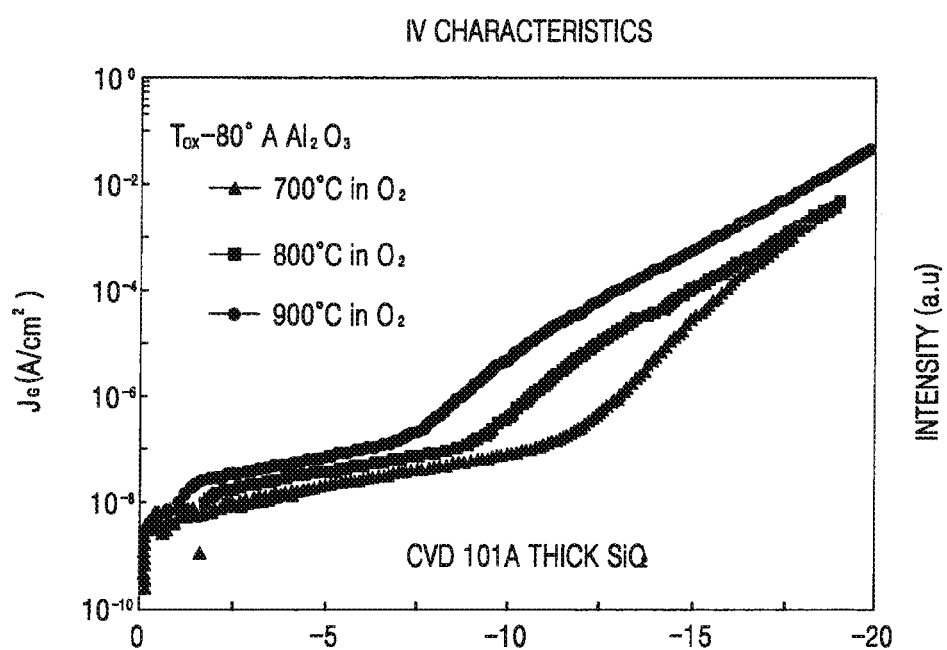
FIG. 2A is a graph illustrating an electric characteristic of the semiconductor memory device of FIGS. 1A and 1B.
Figure 2B:
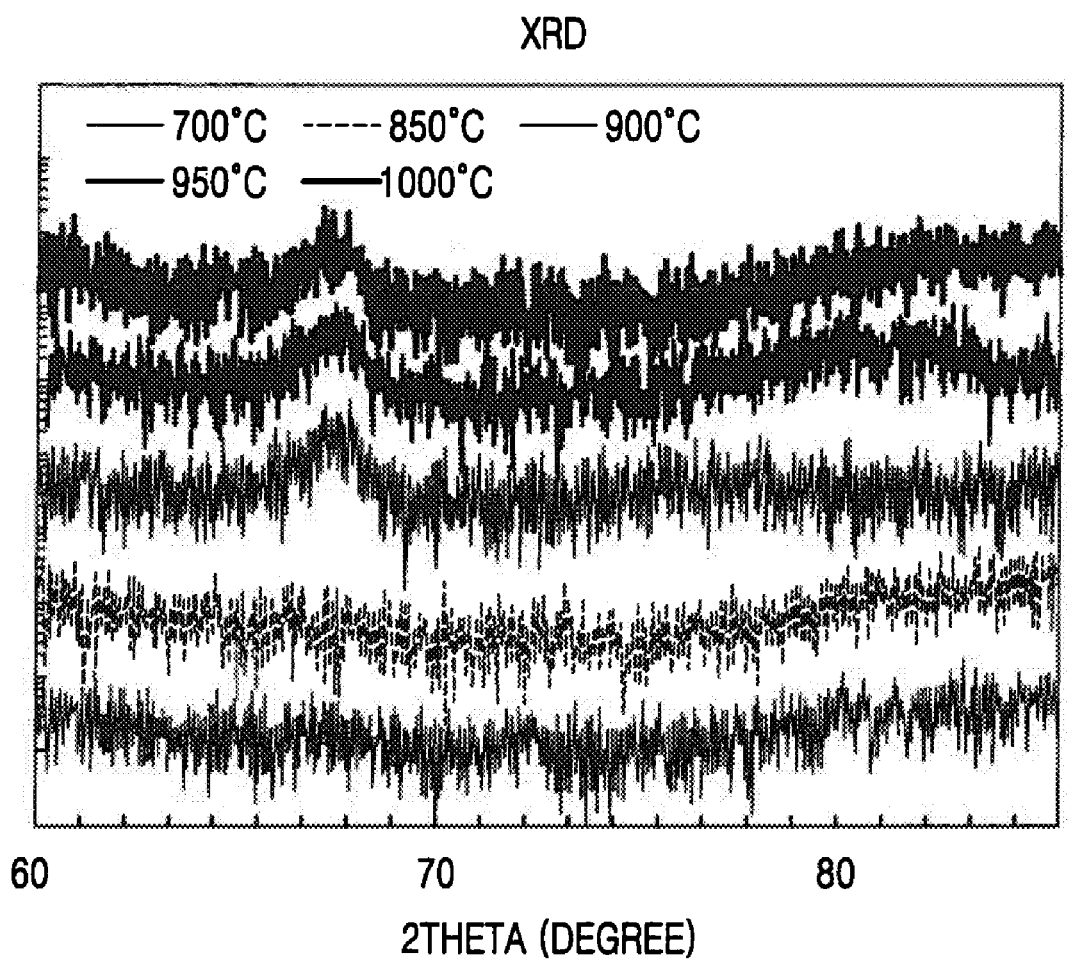
FIG. 2B is a graph illustrating an XRD of the semiconductor memory device of FIGS. 1A and 1B.
Figure 2C:
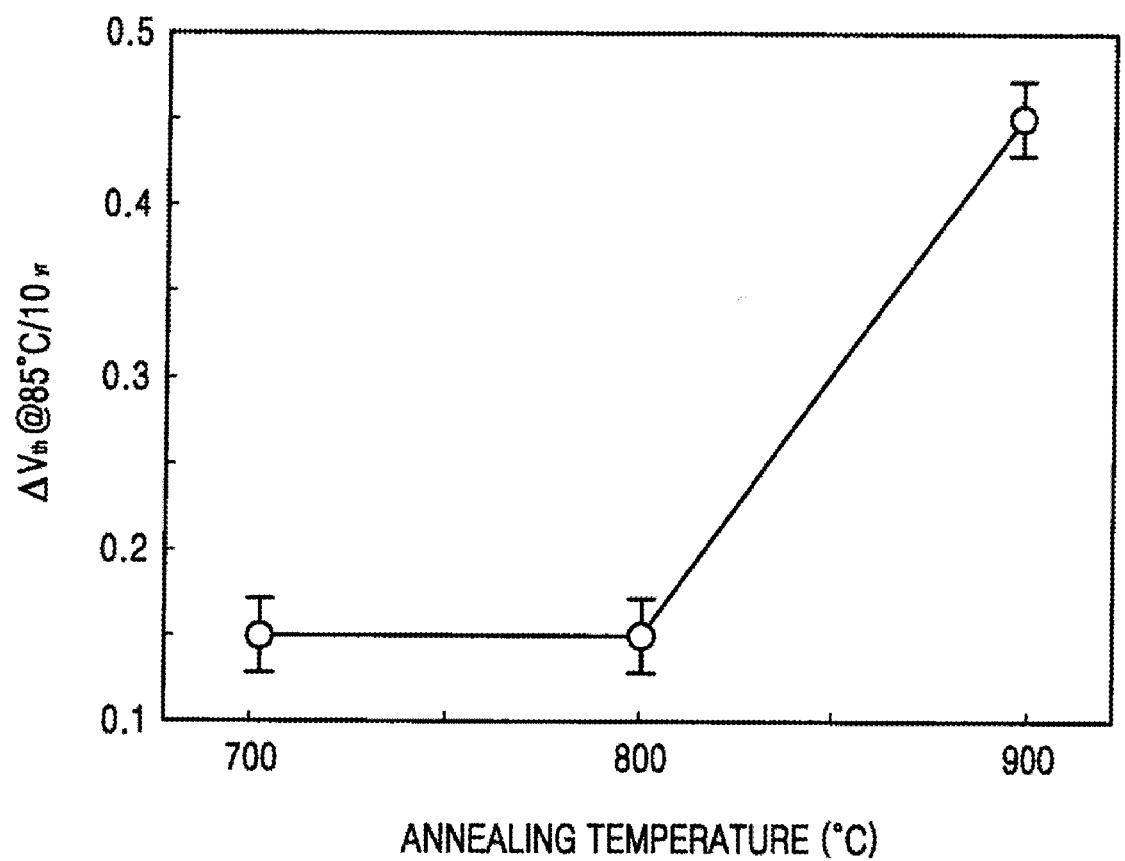
FIG. 2C is a graph illustrating a retention characteristic of the semiconductor memory device of FIGS. 1A and 1B as a function of annealing temperature.

A semiconductor memory device doped with antimony (Sb), gallium (Ga), or bismuth (Bi) and a method of manufacturing the semiconductor memory device according to some embodiments of the invention is described in detail below, with reference to the attached drawings.

FIGS. 3A through 3D are sectional diagrams illustrating a method of manufacturing a semiconductor memory device according to some embodiments of the invention. In the drawings, the thicknesses of layers and regions are exaggerated for clarity. In the illustrated embodiments, a SONOS memory device is described as an example. However, it will be apparent that the inventive principles contained in the illustrated embodiments may be applied to other memory devices including high-k materials such as flash memory devices, floating gate type memories, or the like.

Figure 3A:
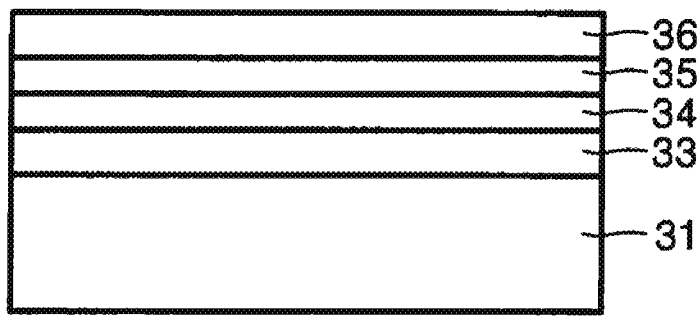
FIGS. 3A through 3D are sectional diagrams illustrating a method of manufacturing a semiconductor memory device doped with Sb, Ga, or Bi according to some embodiments of the invention.

Referring to FIG. 3A, a first oxide layer 33, a charge-trap layer 34, a second oxide layer 35, and a gate electrode layer 36 are sequentially formed on a semiconductor substrate 31. In general, the first oxide layer 33, the charge-trap layer 34, and the second oxide layer 35 are formed of dielectric materials and have the characteristics of an insulator. Here, in a case of the SONOS memory device, the first oxide layer 33 may be referred to as a tunneling oxide layer, and the second oxide layer 35 may be referred to as a blocking oxide layer.

The tunneling oxide layer 33 may be formed of SiO2, the charge-trap layer 34 may be formed of $Si_3N_4$ or $HfO_2$, and the blocking oxide layer 35 may be formed of $Al_2O_3$. Alternatively, the tunneling oxide layer 13, the charge-trap layer 14, and the blocking oxide layer 15 may be formed of other materials.

Figure 3B:
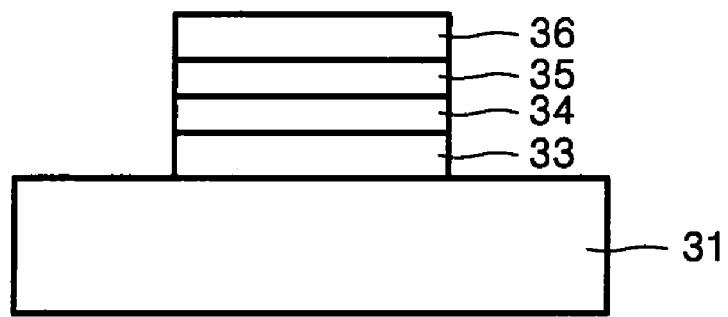

Referring to FIG. 3B, the tunneling oxide layer 33, the charge-trap layer 34, the blocking oxide layer 35, and the gate electrode layer 36 sequentially etched to define a gate structure. As a result, upper surfaces of the semiconductor substrate 31 are exposed on both sides of the gate structure. The resultant structure shown in FIGS. 3A and 3B may be easily manufactured by a generally known semiconductor process.

Figure 3C:
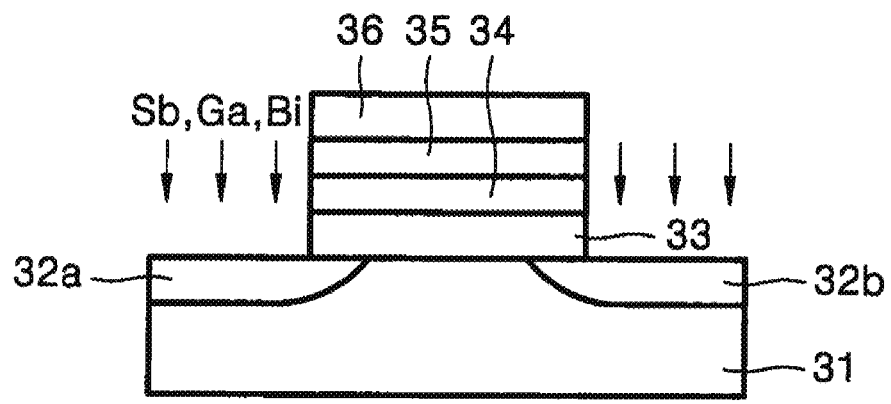

Referring to FIG. 3C, the exposed upper surfaces of the semiconductor substrate 31 are doped with Sb, Ga, or Bi using an ion implantation process or the like. Here, Ga is a p-type dopant, and Sb or Bi is an n-type dopant. Ga, Sb, or Bi may be selectively used depending on a doping state of the semiconductor substrate 31. If the semiconductor substrate 31 is a p-type substrate, the upper surfaces of the semiconductor substrate 31 may be doped with Sb or Bi to form first and second dopant areas 32a and 32b. If the semiconductor substrate 31 is an n-type substrate, the upper surfaces of the semiconductor substrate 31 may be doped with Ga to form the first and second dopant areas 32a and 32b.

Sb, Ga, or Bi is implanted into the semiconductor substrate 31 at an accelerating energy of about 15 keV, and the concentration of Sb, Ga, or Bi may be adjusted within a range between $5 \times 10^{14}/cm^2$ and $10^{16}/cm^2$.

Figure 3D:
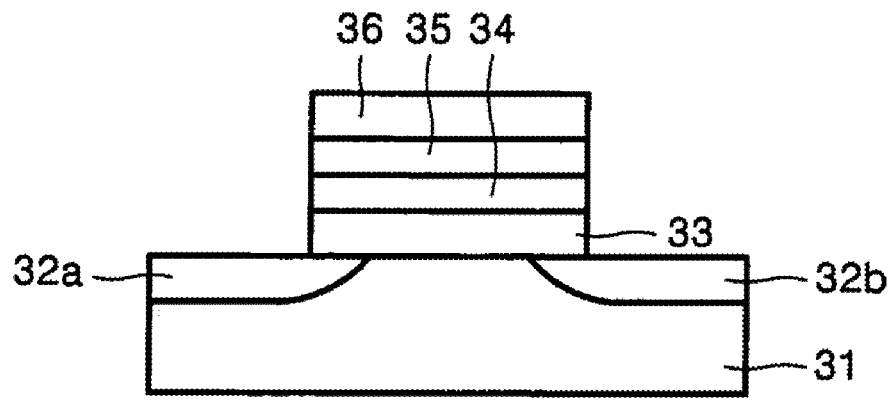

Referring to FIG. 3D, an annealing process is performed at a temperature between 500-850° C. (when Sb or Bi is used as a dopant) or 500-700° C. (when Ga is used as a dopant), which is lower than a range between 950° C. and 1000° C. for an annealing temperature range according to the conventional art. If the annealing process is performed for several seconds to several minutes, the first and second dopant areas 32a and 32b may be activated.

The characteristics of a semiconductor memory device doped with Sb, Ga, or Bi according to some embodiments of the invention are described in further detail below with reference to the drawings.

Figure 4A:
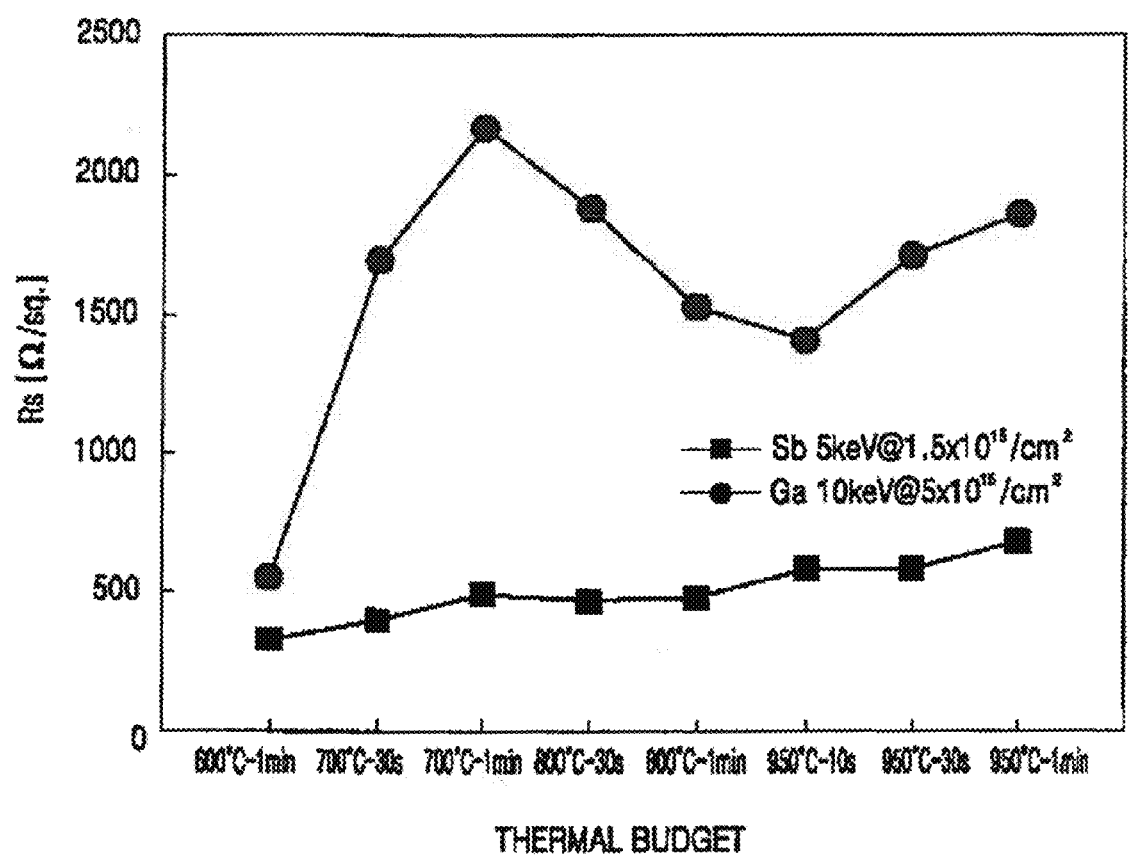
FIG. 4A is a graph illustrating a surface resistance Rs of a semiconductor memory device including dopant areas doped with Sb or Ga as a function of annealing temperature and time.
Figure 4B:
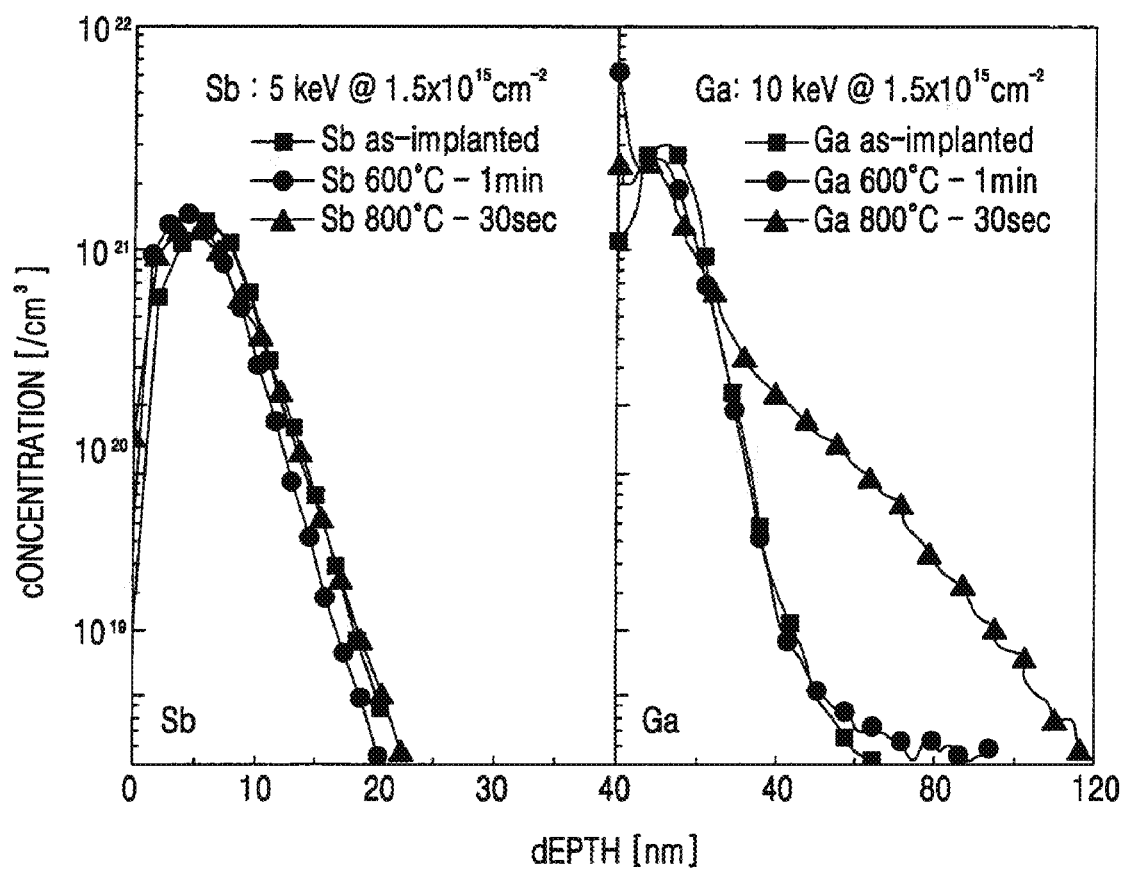
FIG. 4B is a graph illustrating a composition characteristic of the semiconductor memory device including the dopant areas doped with Sb or Ga as a function of the depth of the dopant areas.
Figure 4C:
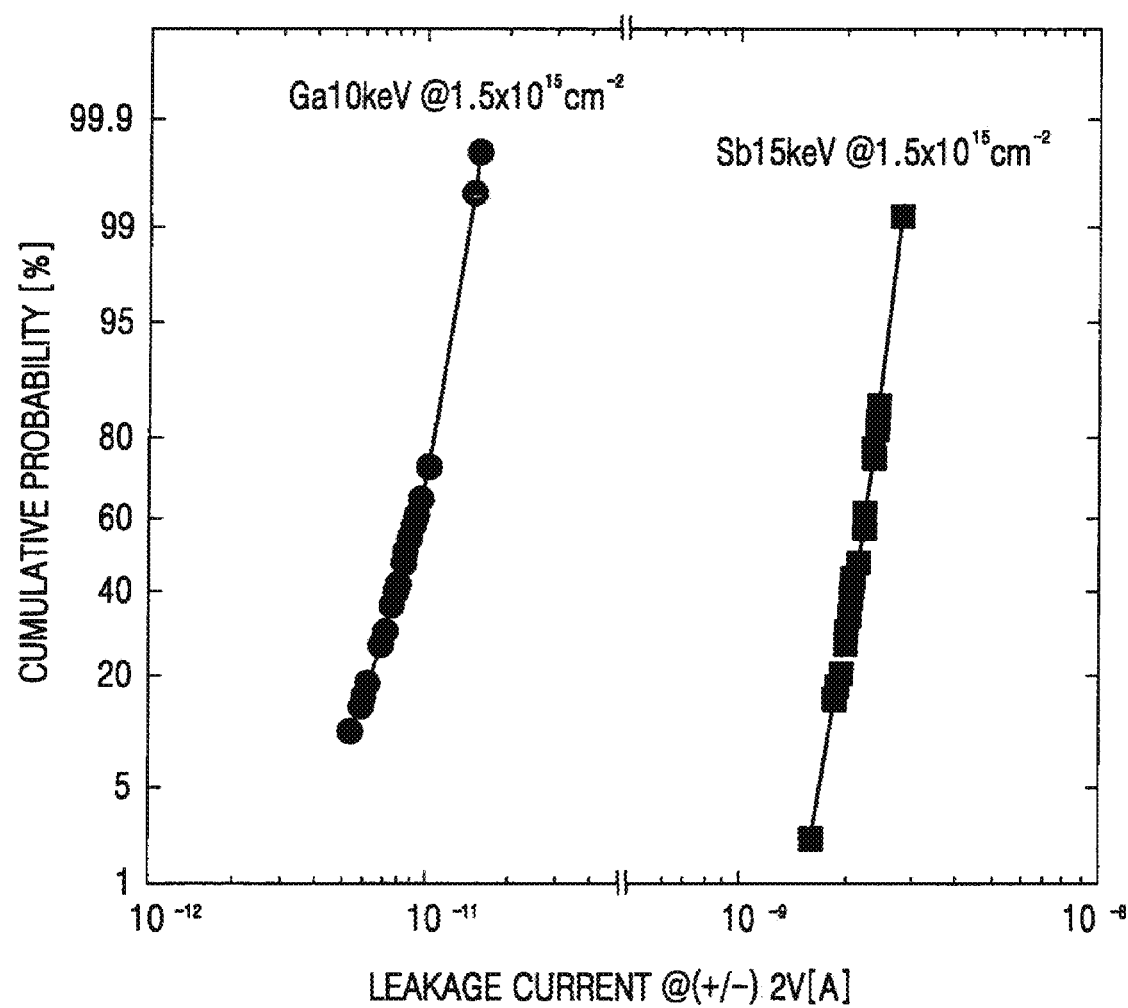
FIG. 4C is a graph illustrating a leakage current characteristic of the semiconductor memory device including the dopant areas doped with Sb or Ga.

FIGS. 4A through 4C are graphs illustrating the characteristics of the semiconductor memory device including the first and second dopant areas 32a and 32b doped with Sb or Ga according to some embodiments of the invention.

FIG. 4A is a graph illustrating a surface resistance of the semiconductor memory device as a function of annealing temperature and time. Here, when Sb is used as a dopant, Sb may be doped at a concentration of $1.5 \times 10^{15}/cm^2$ and at an accelerating voltage of 5 keV. When Ga is used as a dopant, Ga may be doped at concentration of $5 \times 10^{15}/cm^2$ and at an accelerating voltage of 10 keV. Referring to FIG. 4A, it can be seen that the semiconductor memory device has an overall low surface resistance when Sb is the dopant, but when Ga is the dopant the surface resistance is greater compared to when Sb is the dopant. Also, when Ga is the dopant, the surface resistance increases as the annealing temperature and the annealing time increase.

FIG. 4B is a graph illustrating a concentration of Sb or Ga measured by adjusting annealing temperature and time for the semiconductor memory device including the first and second dopant areas 32a and 32b doped with Sb or Ga, as a function of the depth of the first and second dopant areas 32a and 32b.

Referring to the left-hand side of FIG. 4B, when a memory device specimen is doped with Sb, the memory device specimen hardly varies when being doped with Sb at temperatures of 600° C. and 800° C., respectively.

Referring to the right-hand side of FIG. 4B, when a memory device specimen is doped with Ga and annealed at a temperature of 950° C. for 30 minutes, the diffusion of Ga is more accelerated than when a Ga-doped semiconductor memory device is annealed at a temperature of 600° C. for 1 minute, and thus Ga exists to a depth of 120 nm. When annealing is performed on a Ga-doped semiconductor memory device at the temperature of 600° C. for 1 minute, there is not an appreciable difference from the case where annealing is not performed.

FIG. 4C is a graph illustrating a leakage current measured after the semiconductor memory device including the first and second dopant areas 32a and 32b doped with Sb or Ga is annealed at a temperature of 600° C. for 1 minute. Specimens doped with Sb and Ga have low leakage current values. Thus, the specimens doped with Sb and Ga have high leakage current characteristics.

Figure 5A:
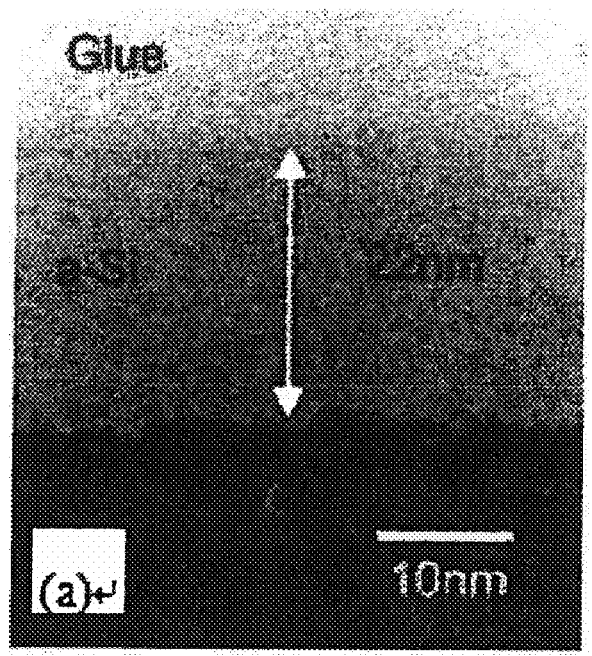
FIGS. 5A and 5B are transmission electron microscopy (TEM) analysis photos before and after annealing after doping Ga.

FIG. 5A is a view illustrating a TEM image of a semiconductor memory device that is doped with Ga but not annealed.

Figure 5B:
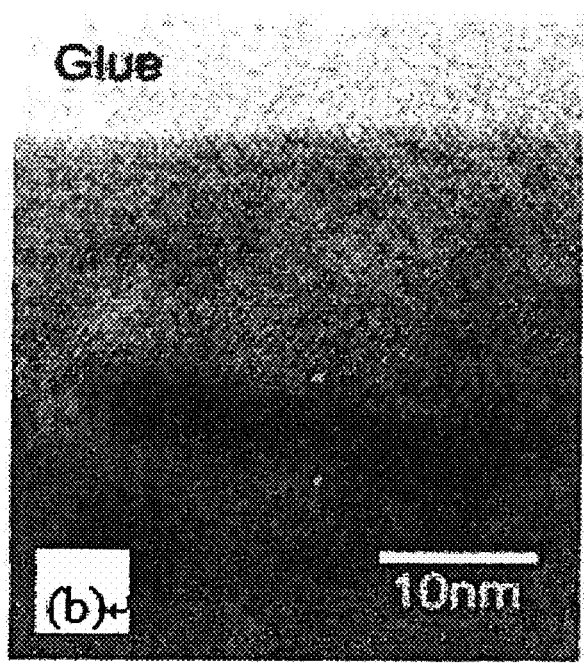

FIG. 5B is a view illustrating a TEM image of the semiconductor memory device including dopant areas doped with Ga and annealed at a temperature of 600° C. for 1 minute. Here, Ga is doped at a concentration of $5 \times 10^{15}/\text{cm}^2$ at an accelerating voltage of 10 keV.

Figure 5C:
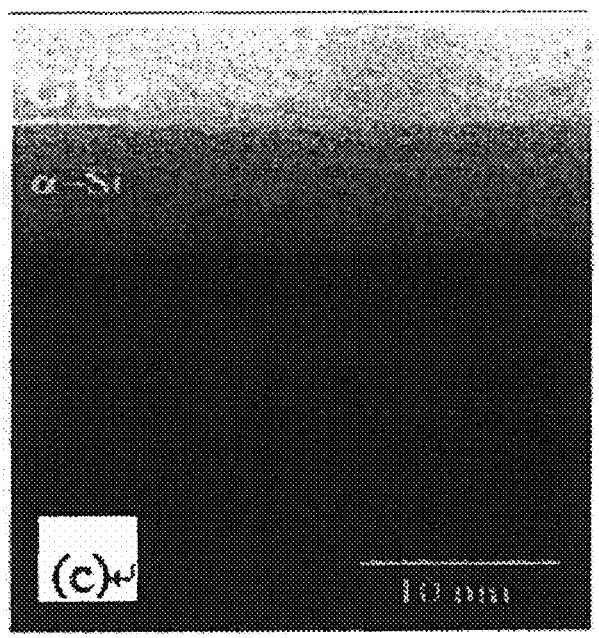
FIGS. 5C and 5D are TEM analysis photos before and after annealing after doping Sb.
Figure 5D:
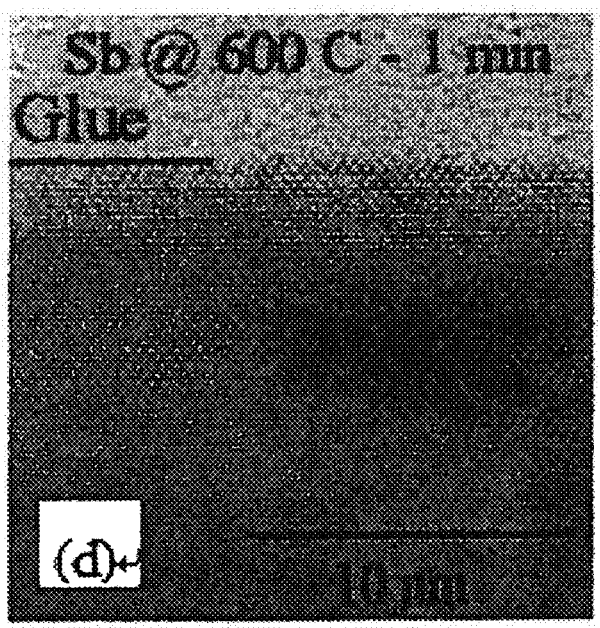

FIG. 5C is a view illustrating a TEM image of a semiconductor memory device that is doped with Sb but not annealed, and FIG. 5D is a view illustrating a TEM image of the semiconductor memory device including dopant areas doped with Sb and annealed at a temperature of 600° C. for minutes. Here, Sb is doped at a concentration of $1.5 \times 10^{15}/\text{cm}^2$ at an accelerating voltage of 5 keV.

Referring to FIGS. 5A through 5D, the dopant areas are not crystallized immediately after an initial doping. However, the dopant areas are annealed at the temperature of 600° C. for 1 minute and thus crystallized. Thus, the dopant areas are activated.

FIGS. 6A through 6D are graphs and an image view illustrating the characteristics of a semiconductor memory device including the first and second dopant areas 32a and 32b doped with Bi. Here, a specimen used for measuring the characteristics of the semiconductor memory device is doped with Bi at a concentration of $7 \times 10^{14}/\text{cm}^2$ at an accelerating voltage of 5 keV and then annealed at varying temperatures for varying amounts of time.

Figure 6A:
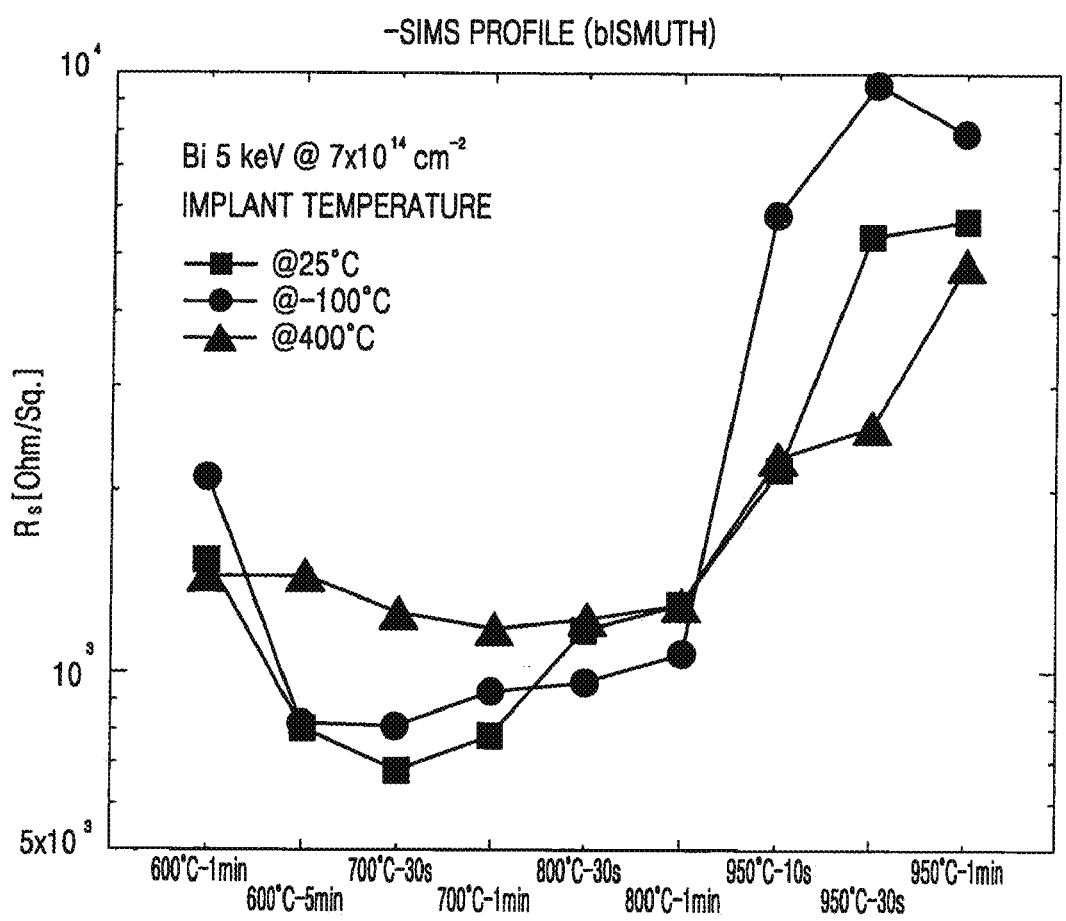
FIG. 6A is a graph illustrating a surface resistance Rs of a semiconductor memory device including dopant areas doped with Bi as a function of annealing temperature and time.

FIG. 6A is a view illustrating a surface resistance of the semiconductor memory device measured as a function of annealing temperature and time, while varying the annealing temperature. Specimens annealed at a temperature of 800° C. or less have low surface resistances. Surface resistances of specimens annealed at a temperature of 950° C. are increased.

Figure 6B:
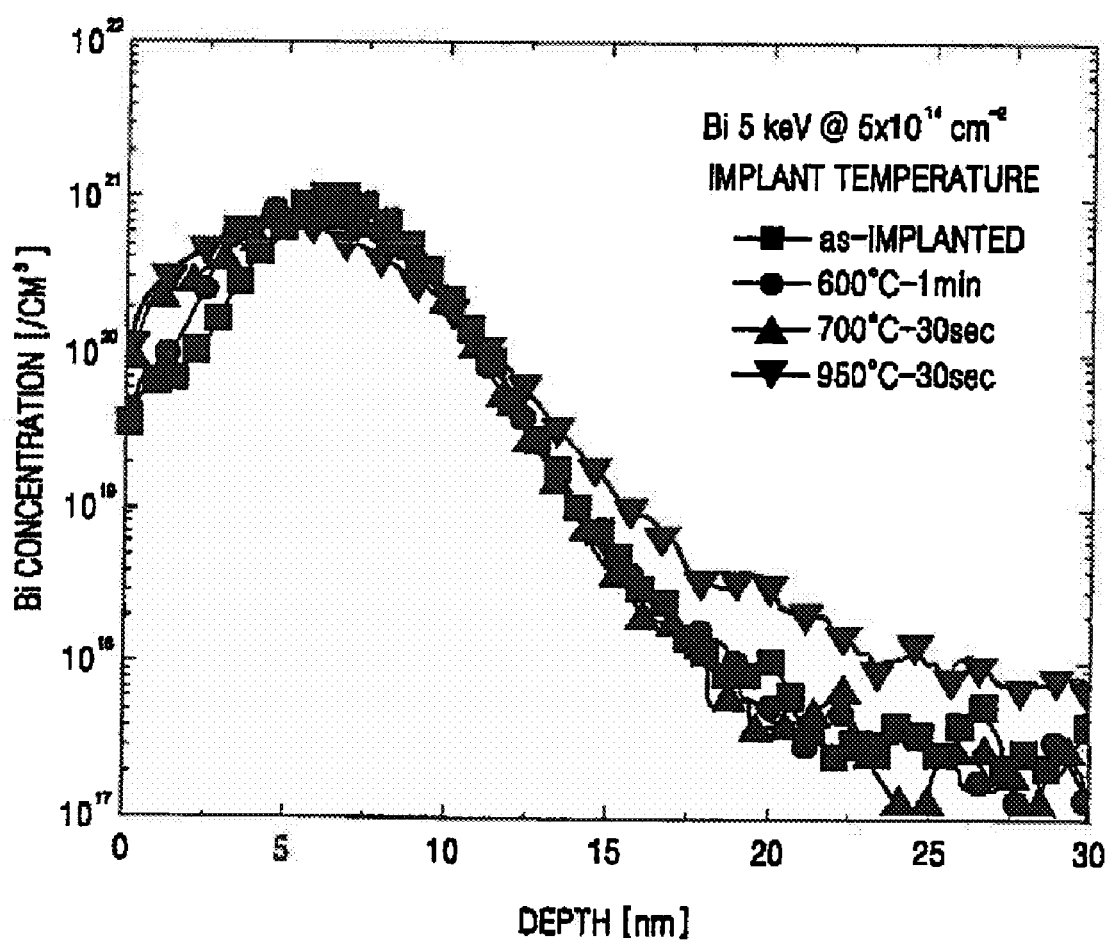
FIG. 6B is a graph illustrating a composition characteristic of the semiconductor memory device including the dopant areas doped with Bi as a function of the depth of the dopant areas.

FIG. 6B is a graph illustrating a concentration of Bi doped on the first and second dopant areas 32a and 32b of the semiconductor memory device, the concentration being measured as a function of the depth of the dopant areas 32A and 32B for varying values of annealing temperature and time.

Referring to FIG. 6B, a concentration of a dopant doped on a specimen annealed at a temperature of 700° C. or less is similar to a concentration of a dopant doped on a specimen that is not annealed. However, when a specimen is annealed at a temperature of 950° C. for 10 seconds, the diffusion of dopant is accelerated. In particular, a concentration of dopant is relatively high up to a depth of about 15 nm.

Figure 6C:
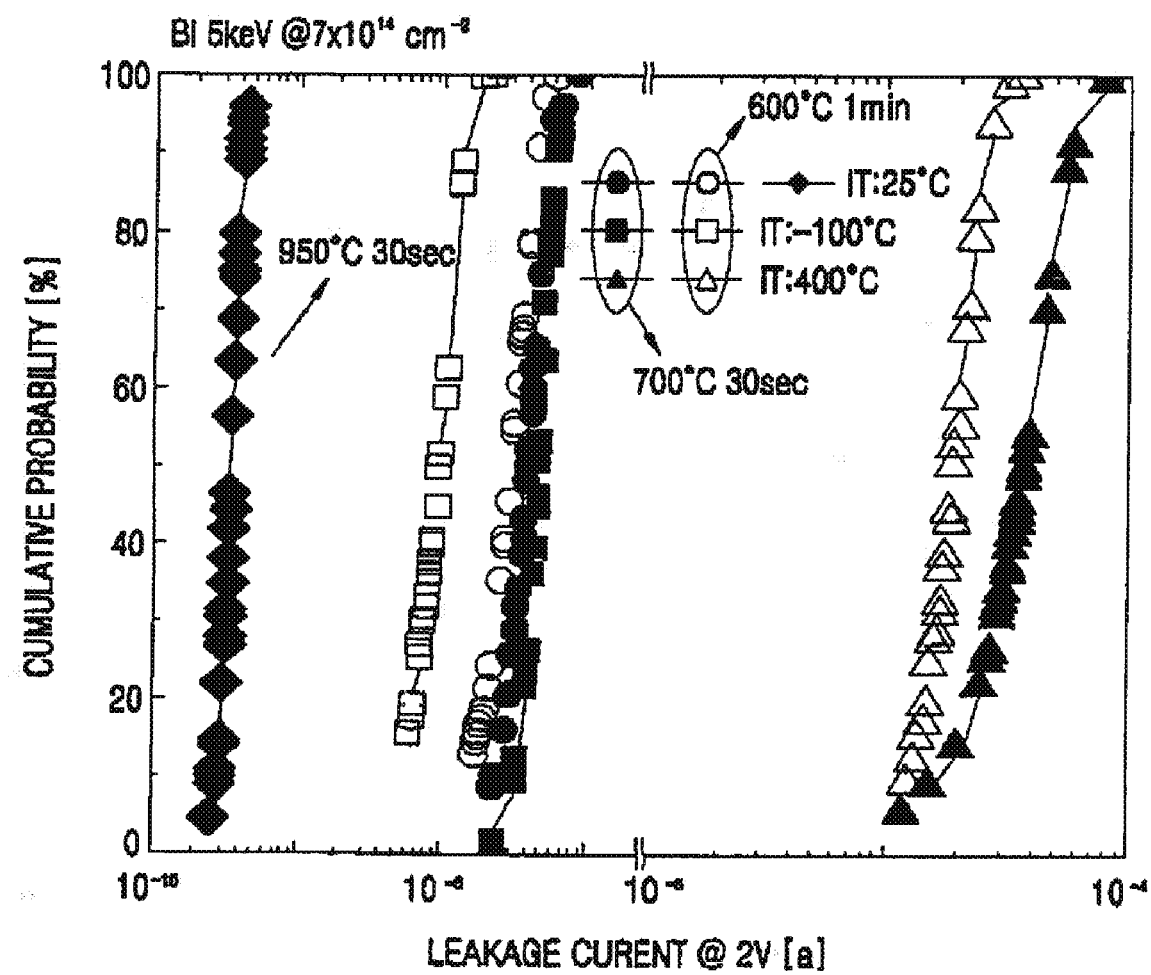
FIG. 6C is a graph illustrating a leakage current characteristic of a semiconductor memory device including dopant areas doped with Sb or Ga.

FIG. 6C is a graph illustrating a leakage current measured after the semiconductor memory device including the first and second dopant areas 32a and 32b doped with Bi is annealed at a temperature of 600° C. for 1 minute. The semiconductor memory device has a low leakage current value and thus a high leakage current characteristic.

Figure 6D:
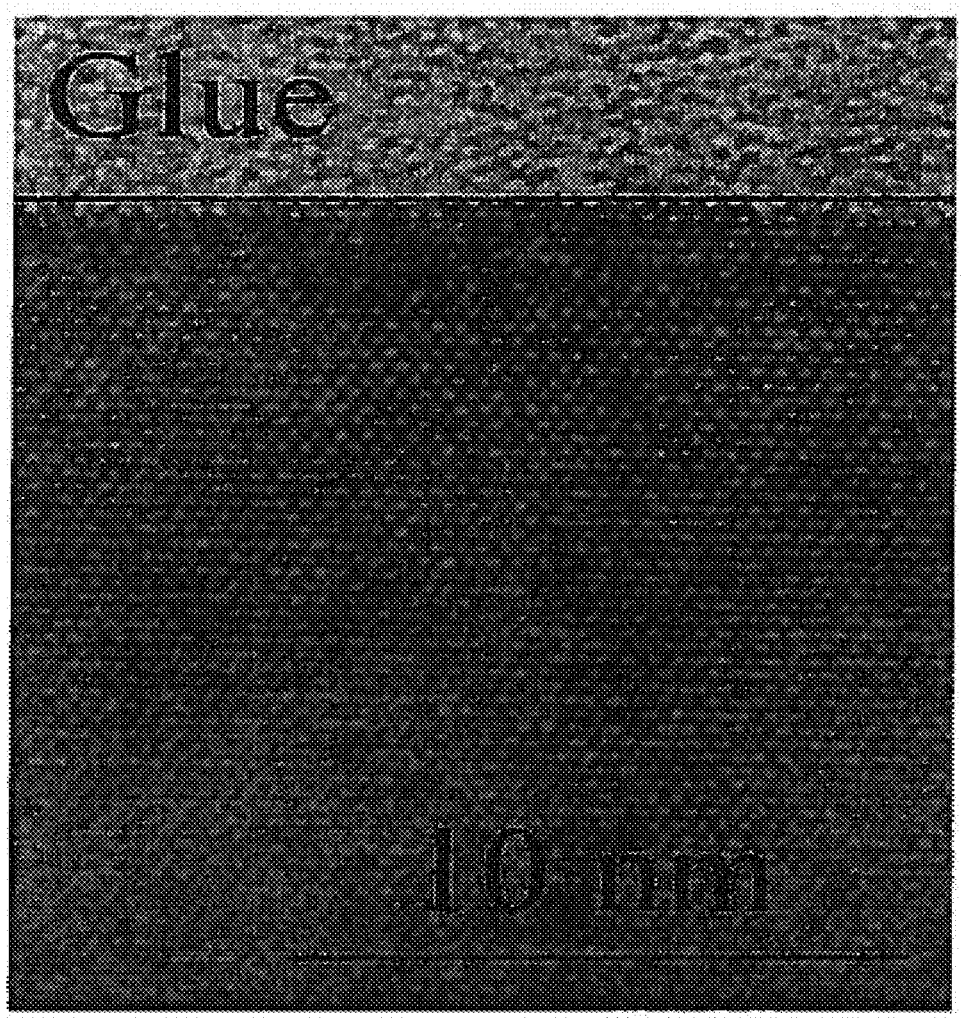
FIG. 6D is a TEM image of a semiconductor memory device including dopant areas doped with Bi and then annealed at a temperature of 600° C. for 1 minute.

FIG. 6D is TEM image of a semiconductor memory device including dopant areas doped with Bi and annealed at the temperature of 600° C. for 1 minute. Referring to FIG. 6D, the dopant areas are not crystallized immediately after initial doping. However, after the semiconductor memory device is annealed at the temperature of 600° C. for 1 minute, the dopant areas are crystallized and thus activated.

According to embodiments of the invention, Sb, Ga, or Bi may be used as a dopant that is to be used on first and second dopant areas in a flash memory device, an SONOS memory device, a floating gate type memory device, or a charge-trap memory. Thus, an annealing temperature can be lowered to prevent a high-k material used in the memory device from being crystallized. As a result, a leakage current can be reduced, and thus a retention characteristic of the semiconductor memory device can be improved. Also, generally known processes for manufacturing a semiconductor device may be used, albeit modified in accordance with the inventive principles described above.

The invention may be practiced in many ways. What follows is an exemplary, non-limiting description of some embodiments of the invention.

According to some embodiments, a semiconductor memory device includes first and second dopant areas formed by doping a semiconductor substrate with one of Sb, Ga, and Bi, an insulating layer formed on the semiconductor substrate so as to contact the first and second dopant areas and comprising a charge-trap layer and a high dielectric layer, and a gate electrode layer formed on the insulating layer.

According to some embodiments, the insulating layer may include a tunneling oxide layer, a data storing layer, and a blocking oxide layer. The blocking oxide layer may be formed of a material having a high dielectric constant.

According to some embodiments, the semiconductor substrate may be a p-type substrate, and the first and second dopant areas may be doped with Sb or Bi.

According to some embodiments, the semiconductor substrate may be an n-type substrate, and the first and second dopant areas may be doped with Ga.

According to some embodiments, a method of manufacturing a semiconductor memory device includes forming an insulating layer including a charge-trap layer and a dielectric layer and a gate electrode layer, removing both sides of each of the insulating layer and the gate electrode layer to expose upper surfaces of both sides of the semiconductor substrate, doping the exposed upper surfaces of the both sides of the semiconductor substrate with Sb, Bi, or Ga to form first and second dopant areas, and performing annealing to activate the first and second dopant areas.

According to some embodiments, the doping of the exposed upper surfaces of the both sides of the semiconductor substrate may be performed at an accelerating energy of about 15 keV or less.

According to some embodiments, a concentration of a dopant doped on the exposed upper surfaces of the semiconductor substrate may be within a range between $5 \times 10^{14}/\text{cm}^2$ and $10^{16}/\text{cm}^2$.

According to some embodiments, the annealing may be performed at a temperature of 850° C. or less.

The preferred embodiments described above should be construed as exemplary and illustrative of the inventive principles contained in the preferred embodiments rather than as limiting the scope of the invention. For example, although the preferred embodiments were described above in the context of a SONOS memory device, the inventive principles contained in those preferred embodiments may be applied to other memory devices such as a flash memory device, a floating gate type memory device, or a charge-trap memory. Therefore, the scope of the invention is not defined not by the detailed description of the invention but by the appended claims.

Furthermore, the written description contains one or more references to particular embodiments of the invention, each particular embodiment serving to illustrate one or more inventive principles taught by the invention. It should be evident that all embodiments contain at least one of the inventive principles described above and that some embodiments may contain more than one of the illustrated inventive principles.

The invention claimed is:

1. A method of manufacturing a semiconductor memory device, comprising:
   depositing an insulating layer on a semiconductor substrate;
   depositing a gate electrode layer on the insulating layer;
   removing a portion of the gate electrode layer and a portion of the insulating layer to define a gate area and to expose upper surfaces of the semiconductor substrate on both sides of the gate area;
   doping the upper surfaces of the semiconductor substrate with a dopant to form a first dopant area and a second dopant area, the dopant selected from the group consisting of Sb, Bi, and Ga; and
   annealing the upper surfaces of the semiconductor substrate to activate the first dopant area and the second dopant area.

2. The method of claim 1, wherein depositing the insulating layer comprises depositing the insulating layer on a p-type substrate, and wherein the dopant includes one selected from the group consisting of Sb and Bi.

3. The method of claim 2, wherein the dopant consists of Sb.

4. The method of claim 2, wherein the dopant consists of Bi.

5. The method of claim 1, wherein depositing the insulating layer comprises depositing the insulating layer on an n-type substrate, and wherein the dopant consists of Ga.

6. The method of claim 1, wherein doping the upper surfaces of the semiconductor substrate comprises doping at an accelerating energy of about 15 keV or less.

7. The method of claim 1, wherein doping the upper surfaces of the semiconductor substrate with the dopant comprises doping with the dopant at a concentration within a range between about $5 \times 10^{14}/cm^2$ and about $10^{16}/cm^2$.

8. The method of claim 1, wherein annealing the upper surfaces comprises annealing at a temperature no greater than 850° C.

9. The method of claim 1, wherein depositing the insulating layer comprises:
   depositing a tunneling oxide layer to contact the semiconductor substrate;
   depositing a charge trap layer to contact the tunneling oxide layer; and
   depositing a blocking oxide layer to contact the charge trap layer.

10. The method of claim 9, wherein depositing the tunneling oxide layer comprises depositing a high-k material.

* * * * *